US008241842B2

(12) United States Patent
Tyszka et al.

(10) Patent No.: US 8,241,842 B2
(45) Date of Patent: Aug. 14, 2012

(54) METHODS AND DEVICES FOR MEASURING DIFFUSION BY MAGNETIC RESONANCE IMAGING

(75) Inventors: Julian Michael Tyszka, Altadena, CA (US); Changjun Yu, Pasadena, CA (US); Daniel Schwartz, San Francisco, CA (US); Ilene Sugino, Madison, NJ (US); Scott E. Fraser, LaCanada-Flintridge, CA (US)

(73) Assignee: California Institute of Technology, Pasadena, CA (US)

( * ) Notice: Subject to any disclaimer, the term of this patent is extended or adjusted under 35 U.S.C. 154(b) by 2352 days.

(21) Appl. No.: 11/009,901

(22) Filed: Dec. 10, 2004

(65) Prior Publication Data
US 2005/0163713 A1    Jul. 28, 2005

Related U.S. Application Data

(60) Provisional application No. 60/528,535, filed on Dec. 10, 2003, provisional application No. 60/550,683, filed on Mar. 5, 2004.

(51) Int. Cl.
*C12Q 1/00* (2006.01)
(52) U.S. Cl. ............................ 435/4; 435/29; 436/526
(58) Field of Classification Search .................. 435/4
See application file for complete search history.

(56) References Cited

U.S. PATENT DOCUMENTS
5,738,826 A    4/1998   Lloyd

OTHER PUBLICATIONS

Iloven et al.,MRI-Based D2O/H2O-Contrast method to study water flow and distribution in heterogeneous systems: demonstration in wood xylem, Journal of Magnetic Resonance, vol. 149, 2001 p. 36-44.*
Shepherd e tal., Simultaneous Diffusion MRI Measurements from Mulitple Perfused Rat Hippocampal Slices, Magnetic Resonance in Medicine, vol. 48, p. 565-569, 2002.*
Seo et al., Journal of Physiology (2002), 545.1, pp. 217-228.
Calabi et al., Journal of Magnetic Resonance, (2002), 156, pp. 222-229.
Koenig et al., Magn Reson Med. Feb. 1992;23(2):275-86.
Hillenkamp et al., Investigative Ophthalmology & Visual Science, (2004), 45(5): pp. 1493-1498.
Moore et al., Investigative Ophthalmology & Visual Science, (2001), 42(12): pp. 2970-2975.
Sehy et al., Biophysical Journal, (2002), 83: pp. 2856-2863.
Osth et al., "A new method for drug transport studies on pig nasal mucosa using a horizontal ussing chamber," Journal of Pharmaceutical Sciences, vol. 91, No. 5, May 2002, pp. 1259-1273.

* cited by examiner

*Primary Examiner* — Jon P Weber
*Assistant Examiner* — Tiffany Gough
(74) *Attorney, Agent, or Firm* — Gates & Cooper LLP

(57) ABSTRACT

The present invention relates generally to the field of magnetic resonance imaging and, more particularly, to devices and methods used in the observation of the diffusion of molecules across a permeable membrane using magnetic resonance techniques. A typical embodiment of the invention is a method of observing the diffusion of a molecule in a container having a permeable membrane that is disposed between a first solution and a second solution in the container, by using magnetic resonance imaging to obtain an image of the diffusion of the molecule in the first solution across the membrane in to the second solution.

13 Claims, 11 Drawing Sheets
(6 of 11 Drawing Sheet(s) Filed in Color)

METHODS AND DEVICES FOR MEASURING DIFFUSION BY MAGNETIC RESONANCE IMAGING

CROSS REFERENCE TO RELATED APPLICATIONS

This application claims the benefit of U.S. provisional patent application Ser. No. 60/528,535 filed Dec. 10, 2003 and U.S. provisional patent application Ser. No. 60/550,683 filed Mar. 5, 2004. The entire content of these provisional patent applications are incorporated herein by reference.

FIELD OF THE INVENTION

The present invention relates generally to the field of magnetic resonance imaging and, more particularly, to the observation of the diffusion of molecules across a permeable membrane using magnetic resonance imaging techniques.

BACKGROUND OF THE INVENTION

Magnetic resonance imaging (MRI) is a well established technique that is used, for example, to discriminate between normal and pathological tissue samples. MRI image contrast in this technology depends on differences in parameters such as the proton density, the longitudinal relaxation time T1, and the transverse relaxation time T2 for different media. MRI is also used in contexts where parameters such as the magnitude and phase of the transverse magnetization, the magnitude of the longitudinal magnetization, and the resonance frequency (related to spectroscopy) are related to functions such as molecular displacements (e.g., flow and diffusion).

In magnetic resonance imaging (MRI), specialized radio frequency (RF) pulses are typically used to stimulate susceptible protons so that image information may be collected. Three axes, X, Y, and Z, are employed to acquire sufficient positional information about each proton to construct a three dimensional image. Further, each of the three axes is not uniform but comprises a magnetic gradient, allowing each proton to be measured relative to the axis by its position within the gradient.

Because MRI acquires information about susceptible protons, typically hydrogen protons, water and water containing fluids are a common imaging target. In the realm of medical imaging this allows the imaging of diffusion processes involving a wide variety of physiological solutions including those in blood, cerebrospinal fluid, or other water containing bodily fluids. Because fluids are relatively mobile compared to other bodily tissues, special imaging techniques must often be employed.

SUMMARY OF THE INVENTION

The diffusional permeability of a membrane is a key measure of how easily certain molecules, including water, pass through the membrane by diffusion. In biological tissues, the diffusional permeability may change due to disease, trauma or other failure, and is of significance in the study of many disease processes, including age-related macular degeneration, a leading cause of blindness in the older population. In this context, embodiments of the present invention provide methods and devices for the observing the diffusion of molecules across a permeable membrane using magnetic resonance techniques. Certain embodiments of the invention are useful for example for measuring changes in diffusional permeability and indices of diffusional permeability of Bruch's membrane (also known as the basal lamina of the choroid or vitreous membrane), one of the layers of the lining of the eyeball.

The invention disclosed herein has a number of embodiments. One embodiment of the invention is a method of using magnetic resonance imaging to observe diffusion across a permeable membrane in a container that comprises: a first solution which includes a molecule selected to impart contrast to a magnetic resonance image; a second solution; and a permeable membrane disposed between the first solution and the second solution. In this method, magnetic resonance imaging techniques are used to obtain an image of the diffusion of the molecule in the first solution across the membrane in to the second solution, such that diffusion across the permeable membrane in the container is observed. These methods of the invention are designed to utilize a wide variety of molecules that impart contrast to a magnetic resonance image. Optionally, a molecule selected to impart contrast to the magnetic resonance image is deuterium oxide ($D_2O$), dissolved oxygen ($O_2$) or a gadolinium chelate. In the methods of the invention, the container may be oriented either horizontally or vertically relative to gravity such that gravity acts across the membrane sample or within the plane of the membrane sample. In certain embodiments of the invention, the upper and lower chambers can be sealed to avoid vapor or gas exchange between the contents of the chambers and the external environment during the course of the measurement.

Embodiments of the invention further include a container for use in magnetic resonance imaging comprising: a cap element having a chamber capable of holding a solution; a base element having a chamber capable of holding a solution; and a sample assembly element capable of holding a permeable membrane disposable between the cap element and the base element. Embodiments of the invention include those where the container includes a washer element disposable between the cap and base elements. Embodiments of the invention include those where the container includes an O-ring disposable between the sample assembly element and the cap element; and an O-ring disposable between the sample assembly element and the base element.

Embodiments of the invention include those where the membrane in the sample assembly is disposed between a first and a second permeable membrane each of which optionally contains one or more apertures which facilitates diffusion through the sample membrane. Embodiments of the invention further include those where the membrane in the sample assembly is disposed between a first and a second impermeable membrane each of which contain one or more apertures which allows diffusion through the sample membrane.

Embodiments of the invention further include kits comprising a group of constituents. One such constituent is a container for use in magnetic resonance imaging comprising: a cap element having a chamber capable of holding a solution; a base element having a chamber capable of holding a solution; and a sample assembly element capable of holding a permeable membrane disposable between the cap element and the base element. Another constituent of such kits is a vessel that holds a molecule selected to impart contrast to a magnetic resonance image such as deuterium oxide ($D_2O$), dissolved oxygen (O2), or a gadolinium chelate. Another constituent of such kits is instruction for use.

BRIEF DESCRIPTION OF THE FIGURES

The file of this patent contains at least one drawing executed in color. Copies of this patent with color drawing(s)

will be provided by the Patent and Trademark Office upon request and payment of the necessary fee.

FIG. 4C is an example of the mean signal time course within the regions of interest for a different experiment using 12 micron pore-size polycarbonate membrane as the sample. In this case the signal difference between the chambers has been fitted to an exponential and has a time-constant of approximately 48.5 minutes.

FIG. 6A shows a base component. FIG. 6B shows a cap component. FIG. 6C shows a washer component.

DETAILED DESCRIPTION OF THE INVENTION

Figures 1A, 1B, 1C:
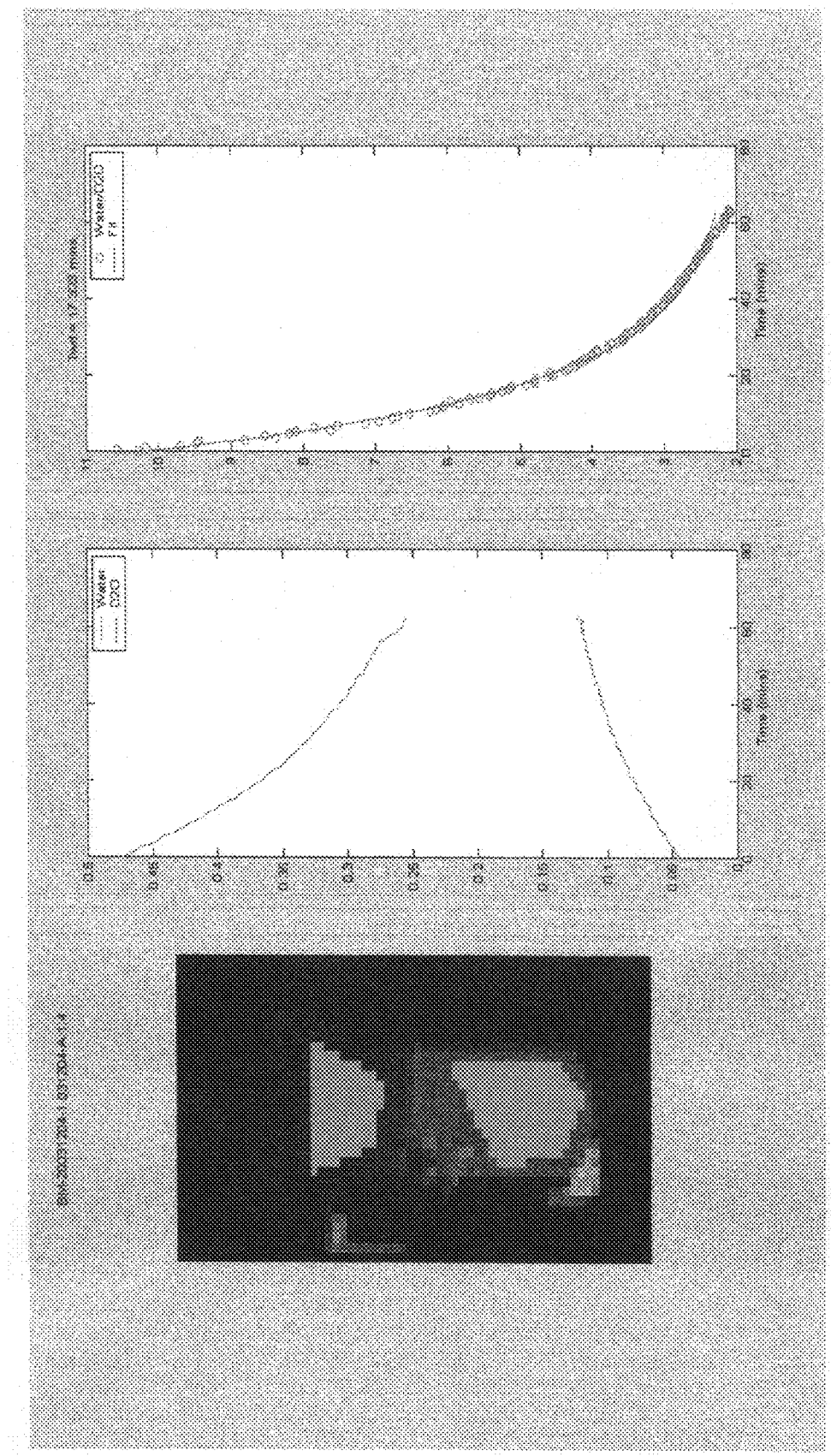
FIGS. 1A-1C provide the results of experiments on $D_2O$-concentration related signal changes in two chambers, one initially containing $D_2O$, the other with $H_2O$. (a) Midplane magnetic resonance image of the membrane chamber showing the upper and lower chambers and overlayed regions of interest for the initial $D_2O$ chamber (which can be green in color photographs) and initial water chamber (which can be red in color photographs). (b) signal variation in the initial water chamber (which can be blue in color photographs) and initial D2O chamber (which can be green in color photographs). (c) Water/D2O chamber signal ratio variation with time and best fit exponential. The time constant for the exchange in this case was approximately 17.3 minutes. In this case the ration of the signals is used to normalize the time-course to signal changes due to unrelated phenomena.

Unless otherwise defined, all terms of art, notations and other scientific terms or terminology used herein are intended to have the meanings commonly understood by those of skill in the art to which this invention pertains. In some cases, terms with commonly understood meanings are defined herein for clarity and/or for ready reference, and the inclusion of such definitions herein should not necessarily be construed to represent a substantial difference over what is generally understood in the art. Many of the techniques and procedures described or referenced herein are well understood and commonly employed using conventional methodology by those skilled in the art. As appropriate, procedures involving the use of commercially available kits and reagents are generally carried out in accordance with manufacturer defined protocols and/or parameters unless otherwise noted.

Embodiments of the invention disclosed herein are used to observe membrane diffusional permeability. The diffusional permeability of a membrane is a key measure of how easily certain molecules, including water, pass through the membrane by diffusion. In membranes of a sample obtained from biological tissues, the diffusional permeability may change due to disease, trauma or other failure, and is of significance in the study of many disease processes. In this context, embodiments of the present invention provide methods and devices for the observing the diffusion of molecules across a permeable membrane using magnetic resonance techniques. Certain embodiments of the invention are useful for example at measuring changes in signal time-courses due to changes in the underlying diffusional permeability of a membrane that is associated with a particular pathology such as macular degeneration (e.g. the Bruch's membrane).

This invention disclosed herein differs from previous art for example in that it employs magnetic resonance imaging to follow both the spatial and temporal evolution of water distribution across a semi-permeable membrane. In certain embodiments of the invention, water can be used as a tracer when paired with $D_2O$ as a negative contrast agent. In addition, the methods of the invention can be performed with zero or close to zero pressure difference across the membrane. Previous experiments measuring the hydraulic conductivity of a biological membrane using for example an Ussing chamber required a significantly larger pressure differential to drive water through a membrane with an associated risk of rupture.

ILLUSTRATIVE EMBODIMENTS OF THE INVENTION

The invention disclosed herein has a number of embodiments. One embodiment of the invention is a method of using magnetic resonance imaging to observe diffusion across a permeable membrane in a container that comprises: a first solution which includes a molecule selected to impart contrast to a magnetic resonance image; a second solution; and a permeable membrane disposed between the first solution and the second solution. In this method, magnetic resonance imaging techniques are used to obtain an image of the diffusion of the molecule in the first solution across the membrane in to the second solution, such that diffusion across the permeable membrane in the container is observed.

The methods of the invention are designed to utilize molecules that impart contrast to a magnetic resonance image. Optionally, a molecule selected to impart contrast to the magnetic resonance image is deuterium oxide ($D_2O$) as shown in Example 1. Alternatively, a molecule selected to impart contrast to the magnetic resonance image is dissolved oxygen ($O_2$) as shown in Example 2. Alternatively, a molecule selected to impart contrast to the magnetic resonance image is a gadolinium chelate such as gadoteridol dimeglamine (Prohance® Bracco Diagnostics) as shown in Example 3. Gadoteridol dimeglamine is one of a class of gadolinium chelates useful in the methods of the invention that have been FDA approved (others include Magnavist and Omniscan) and/or are well known to MR research (such as Gd-DOTA, Gd-DTPA). Embodiments of the invention include those wherein a plurality of molecules that impart contrast to a magnetic resonance image are used in the described methods.

In this context, a wide variety of molecules that impart contrast to a magnetic resonance image and can be used in the methods of the invention are known in the art. Such molecules include gadolinium chelates having a wide variety of membrane crossing properties and/or T1 or T2 contrast agents. Articles regarding illustrative contrast agents and the calculation of diffusive permeability of membranes (e.g. those which either cross the membrane or stay exclusively on one side) both in vivo and in vitro include Seo et al., Journal of Physiology (2002), 545.1, pp. 217-228; Calabi et al., Journal of Magnetic Resonance, (2002), 156, pp. 222-229; and Koenig et al., Magn Reson Med. (1992) Feb.; 23(2): 275-86 the contents of all of which are incorporated herein by reference.

Articles describing related magnetic resonance imaging techniques and contrast agents include Hillenkamp et al., Investigative Ophthalmology & Visual Science, (2004), 45(5): pp. 1493-1498; Moore et al., Investigative Ophthalmology & Visual Science, (2001), 42(12): pp. 2970-2975; and Sehy et al., Biophysical Journal, (2002), 83: pp. 2856-2863, the contents of all of which are incorporated herein by reference. The methods disclosed herein have a number of preferable characteristics over the methods disclosed in the above-noted articles. For example, embodiments of the methods and devices of the present invention can be used in a flat geometry using ex vivo or non-biological membranes. Moreover, embodiments of the disclosed methods and devices do not require fluid flow over the sample, i.e. it can be a closed hydrostatic system with a constant volume as opposed to an open hydrodynamic system (see, e.g. Sehy supra). In addition, embodiments of the disclosed methods and devices allow a measurement of the spatial distribution of $D_2O$ or $O_2$ in the regions neighboring the membrane, a characteristic which allows the spatial variation of an index of diffusional permeability or the apparent diffusional permeability across the membrane to be estimated using appropriate mass transport models.

In some embodiments of the invention, the described methods of using magnetic resonance imaging to observe diffusion across a permeable membrane observe the diffusion of the molecule in the first solution across the membrane in to the second solution in the absence of a pressure differential across the membrane. In other embodiments of the invention, the described methods of using magnetic resonance imaging to observe diffusion across a permeable membrane observe the diffusion of the molecule in the first solution across the membrane in to the second solution in the presence of a pressure differential across the membrane that is less than 100 Pascals, and is typically less than or equal to about 10, 5 or 1 Pascals.

In some embodiments of the methods of the invention, magnetic resonance imaging is used to obtain a plurality of sequential images of the diffusion of the molecule in the first solution across the membrane in to the second solution. Optionally, the sequential magnetic resonance images are acquired of a midline slice through the container that is parallel to the long-axis of the container. Optionally, the sequential magnetic resonance images are acquired of one or more slices either perpendicular to the plane of the membrane sample or parallel to the plane of the membrane sample. Optionally, the sequential magnetic resonance images are acquired of the entire container and its contents using a three-dimensional volume acquisition pulse sequence. In some embodiments of the invention the sequential magnetic resonance images observe a change in the magnetic resonance signal intensity over time. In some embodiments of the invention, the magnetic resonance imaging is used to calculate an index of diffusional permeability or the apparent diffusional permeability of the membrane which is optionally calculated using one of the art accepted techniques such as mean signal time-course measurements and/or mass transport equations.

Figure 7A:
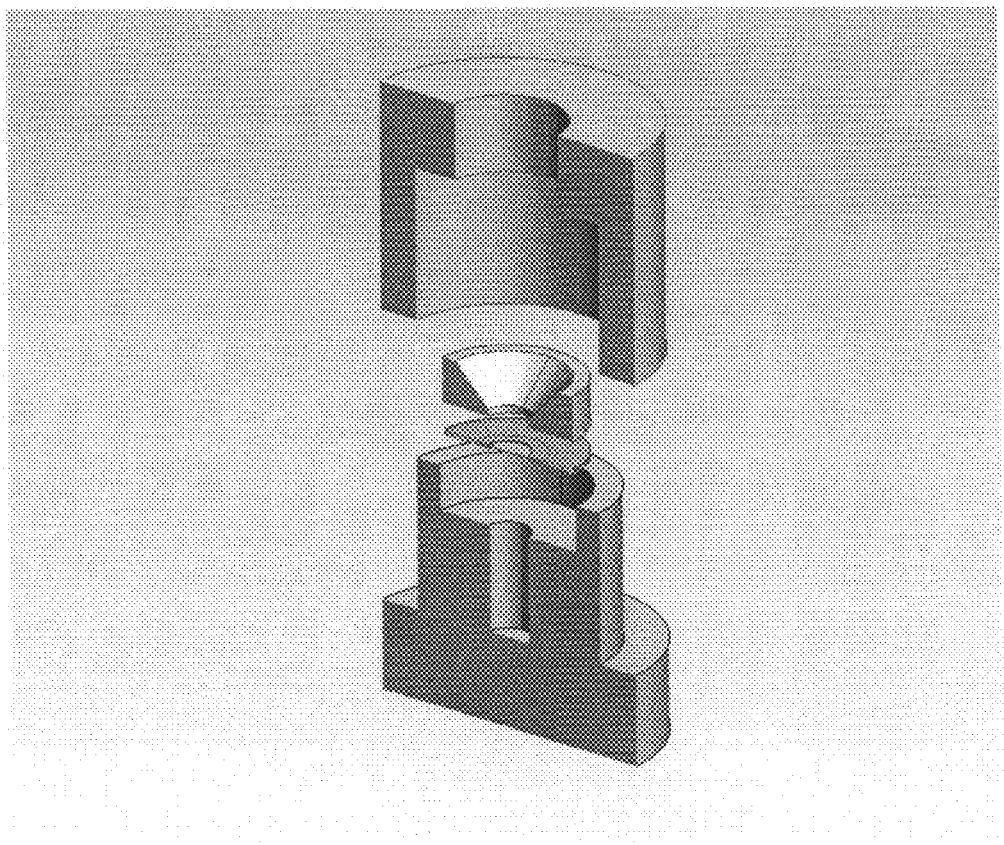
FIGS. 7A-7B provide additional diagrams of typical containers or "membrane cells" that can be used in the methods of the invention. The four components shown in FIG. 7A are from top to bottom: a cap element having a chamber capable of holding a solution; a washer element; a sample assembly element capable of holding a permeable membrane disposable between the cap element and the base element; and a base element having a chamber capable of holding a solution.
Figure 7B:
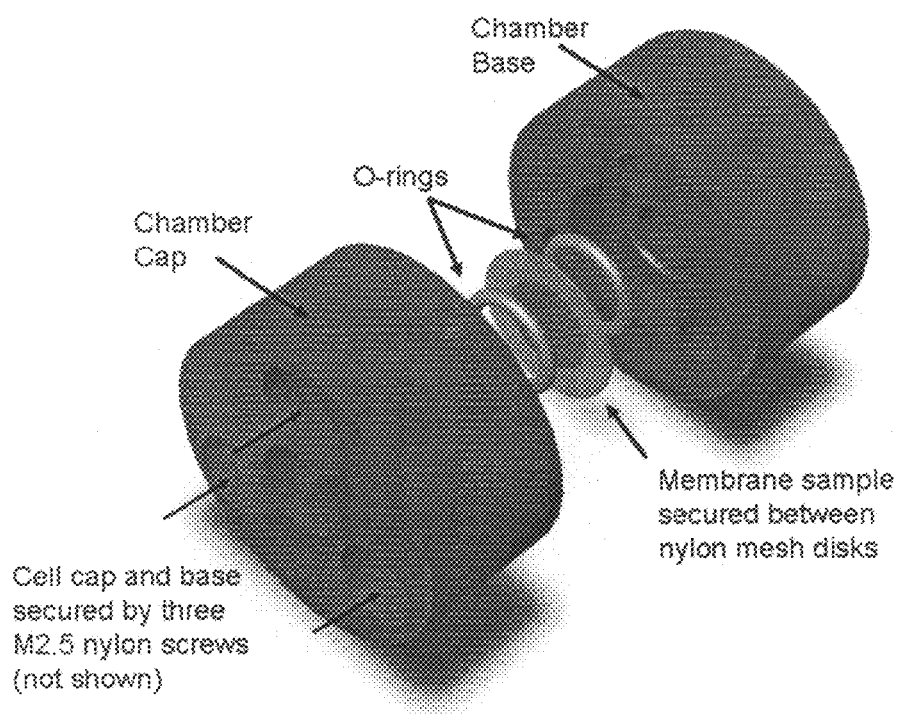

In the methods of the invention, the container can take any one of a variety of different designs such as those shown in FIG. 7. Typically, the container comprises: a cap element having a chamber capable of holding a solution; a base element having a chamber capable of holding a solution; an optional washer element that can be disposed between the cap and base elements; and a sample assembly element capable of holding a permeable membrane that can be disposed between the cap element and the base element.

The container or "membrane cell" is fabricated to be MRI compatible i.e. comprised of a composition where metal and ferromagnetic components are present in very low concentrations and/or are absent. In certain embodiments of the invention, plastics used in the composition of the container or membrane cell have a magnetic susceptibility close to that of water. Typically, the composition of the container is selected to facilitate the magnetic resonance imaging. In one illustrative example, the composition is selected so that it is not ferromagnetic and/or is not metallic.

The methods and devices of the disclosed invention can be used to measure the permeability of a wide variety of both biological membranes as well as manufactured or artificial membranes. In some embodiments of the invention, the membrane is from a biological sample. For example, certain embodiments of the invention are useful for example at measuring changes in an index of diffusional permeability or the apparent diffusional permeability of Bruch's membrane (also known as the basal lamina of the choroid or vitreous membrane), one of the layers of the lining of the eyeball. Example 2 describes the use of a membrane comprising a Bruch's membrane. In other embodiments of the invention, the membrane is the produced by a manufacturing process. Example 2 describes the use of a membrane comprising a polycarbonate film.

Embodiments of the invention include in vitro methods of using magnetic resonance imaging to observe diffusion across a permeable membrane in an article of manufacture that comprises: a first chamber including a solution to which has been added a molecule selected to impart contrast to a magnetic resonance image; a second chamber including a second solution; and a permeable membrane disposed between the first solution and the second solution. In this method, magnetic resonance imaging techniques are used to obtain an image of the diffusion of the molecule in the first solution across the membrane in to the second solution (particularly the appearance of the molecule in the second solution), such that diffusion across the permeable membrane in the article of manufacture is observed.

Embodiments of the invention further include a container for use in magnetic resonance imaging comprising: a cap element having a chamber capable of holding a solution; a base element having a chamber capable of holding a solution; and a sample assembly element capable of holding a permeable membrane disposable between the cap element and the base element. Embodiments of the invention include those where the container includes a washer element disposable between the cap and base elements. Other membrane cell designs do not include a washer, with this element being replaced with screws to compress the base, cap and o-rings. Such designs may avoid torsional damage to fragile samples during setup. Embodiments of the invention also include those where the container includes an O-ring disposable between the sample assembly element and the cap element; and an O-ring disposable between the sample assembly element and the base element. In these containers for use in magnetic resonance imaging their material composition can be designed to facilitate magnetic resonance imaging, for example by not including ferromagnetic compositions and/or is not metallic compositions.

Embodiments of the invention also include those where the membrane in the sample assembly element is disposed (e.g. "sandwiched") between a first and a second permeable matrix. In some embodiments of the invention, the first and/or the second permeable matrix comprises a mesh or a polycarbonate film. In certain embodiments of the invention, the first and/or the second permeable matrix functions to support the membrane in the sample assembly. Embodiments of the invention include those wherein the first and the second impermeable matrix include one or more macroscopic holes so as to impart permeability to the first and the second impermeable matrix. In some embodiments of the invention, the one or more holes in the first and/or the second permeable matrix are created mechanically. In one illustrative embodiment, the first and the second permeable matrix comprises a polycarbonate film having a central hole (akin to that of a donut) to enhance its permeability.

Embodiments of the invention further include a kit comprising a group of constituents. One such constituent of the kit is a container for use in magnetic resonance imaging comprising: a cap element having a chamber capable of holding a solution; a base element having a chamber capable of holding a solution; and a sample assembly element capable of holding a permeable membrane disposable between the cap element and the base element. Another constituent of the kit is a vessel that holds a molecule selected to impart contrast to a magnetic resonance image such as deuterium oxide ($D_2O$), dissolved oxygen ($O_2$), or a gadolinium chelate. Another constituent of the kit is instruction for use.

EXAMPLES

Example 1

Devices and Methods for Measuring Membrane Diffusional Permeability of Deuterium Oxide by Magnetic Resonance Imaging Example 1A Membrane Cell Preparation A 5 mm diameter tissue sample is mounted with tissue adhesive between two plastic disks with a central 3 mm hole in each disk to allow diffusion across the membrane. The central well of the membrane cell base is filled with either water or $D_2O$ (deuterium oxide). This sample assembly is then inserted in the upper circular recess of the membrane cell base. The membrane cell washer is then placed over the sample assembly and the membrane cell cap screwed onto the base, tightening the washer onto the sample assembly. The upper central well in the membrane cell cap is then filled with either $D_2O$ or water (the opposite of the contents of the lower well) and the sample placed in the magnetic resonance imaging system.

Magnetic Resonance Imaging

Sequential magnetic resonance images are acquired of a midline slice through the membrane cell, parallel to the long-axis of the cell. Sufficient images are acquired to record the change in signal intensity in the upper and lower chambers as the $D_2O$ and water exchange across the membrane. $D_2O$ gives no signal in conventional 1H MRI, and thus acts as a negative marker. The diffusional permeability can then be calculated from the signal time-course using conventional mass transport equations assuming that signal intensity is proportional to water concentration.

Results

FIG. 1 provides the results of experiments on $D_2O$-concentration related signal changes in two chambers, one initially containing $D_2O$, the other with $H_2O$.

Example 1B

Membrane Cell Preparation

A 5 mm diameter membrane tissue sample is mounted between two layers of 125 micron pore-size nylon mesh. The tissue sample assembly is then mounted in the central recess of the cell base and the cell cap is tightened onto the base using three M2.5 nylon screws. O-rings mounted into the cap and base prevent fluid leakage between the upper and lower central chambers. The central well of the base is filled with water or saline water with the cell inverted. The base well is then sealed with impermeable adhesive tape. The central well of the upper chamber is filled with deuterium oxide ($D_2O$) or $D_2O$ saline and sealed with impermeable adhesive tape as before.

Magnetic Resonance Imaging

Sequential magnetic resonance images are acquired of a midline slice through the membrane cell, parallel to the long-axis of the cell. Sufficient images are acquired to record the change in signal intensity in the upper and lower chambers as the D$_2$O and water exchange across the membrane. D$_2$O gives no signal in conventional $^1$H MRI, and thus acts as a negative marker. The diffusional permeability can then be calculated from either the mean signal time-courses in the upper and lower chambers using conventional mass transport equations assuming that signal intensity is proportional to water concentration.

Results

Figure 2:
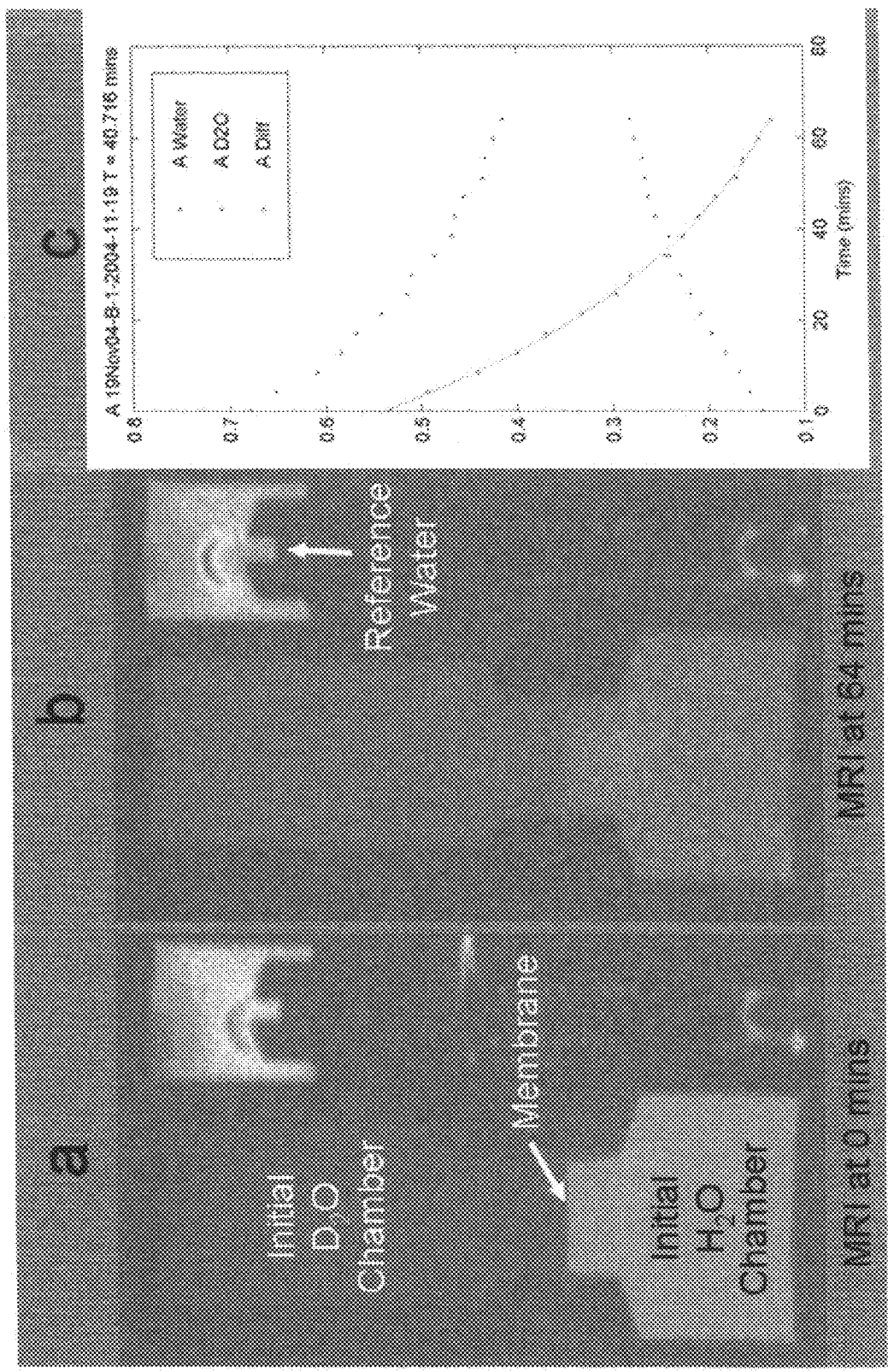
FIGS. 2A-2C provide the results of experiments on $D_2O$-concentration related signal changes in two chambers, one initially containing $D_2O$, the other with $H_2O$. Cross-sectional T1-weighted magnetic resonance image through the membrane cell during permeability testing of a single layer of 12 micron pore-size polycarbonate membrane. Images at (a) time=0 minutes and (b) 64 minutes are shown. Images were acquired every 256 seconds. Initially the upper chamber contained deuterium oxide saline and the lower chamber contained water saline. Over the course of 64 minutes, the difference in signal (dots in c) between the two chambers decayed as shown in the graph at right. In this case a simple exponential function in time was used to model the mean difference decay (line in c). The time-constant of the fitted exponential decay was estimated as 40.7 minutes and can be used as an index of membrane permeability. Spatially resolved MR imaging also allows more complex modeling of the mass transport close to the membrane. In this case a reference body of water isolated from the upper and lower chambers is used to normalize the time-course to signal changes due to unrelated phenomena.

FIG. 2 provides the results of experiments on D$_2$O-concentration related signal changes in two chambers, one initially containing D$_2$O, the other with H$_2$O. Cross-sectional T1-weighted magnetic resonance image through the membrane cell during permeability testing of a single layer of 12 micron pore-size polycarbonate membrane. Images at (a) time=0 minutes and (b) 64 minutes are shown. Images were acquired every 256 seconds. Initially the upper chamber contained deuterium oxide saline and the lower chamber contained water saline. Over the course of 64 minutes, the difference in signal (red dots in c) between the two chambers decayed as shown in the graph at right. In this case a simple exponential function in time was used to model the mean difference decay (pale blue line in c). The time-constant of the fitted exponential decay was estimated as 40.7 minutes and can be used as an index of membrane permeability. Spatially resolved MR imaging also allows more complex modeling of the mass transport close to the membrane.

Example 2

Devices and Methods for Measuring Membrane Diffusional Permeability of Oxygen (O$_2$) by Magnetic Resonance Imaging Membrane Cell Preparation A 5 mm diameter artificial or biological membrane sample is mounted with tissue adhesive between two plastic disks with a central 3 mm hole in each disk to allow diffusion of oxygen across the membrane. The central well of the membrane cell base is filled with oxygen saturated aqueous solution. This sample assembly is then inserted in the upper circular recess of the membrane cell base. The membrane cell washer is then placed over the sample assembly and the membrane cell cap screwed onto the base, tightening the washer onto the sample assembly. The upper central well in the membrane cell cap is then filled with inert gas (e.g. argon or nitrogen) saturated aqueous solution and sample placed in the magnetic resonance imaging system.

Magnetic Resonance Imaging

Sequential T$_1$-weighted magnetic resonance images are acquired of a midline slice through the membrane cell, parallel to the long-axis of the cell. Sufficient images are acquired to record the change in signal intensity in the upper and lower chambers as the oxygen and inert gas exchange across the membrane. Dissolved oxygen reduces the T$_1$ (longitudinal or spin-lattice) relaxation time of the aqueous solution and thus imparts contrast to the MR image. An index of diffusional permeability for dissolved oxygen can then be calculated from the signal time-course using conventional mass transport equations assuming that relaxation time change is a monotonic function of oxygen concentration.

The generalized exponential decay to equilibrium in two chamber system, including systematic drift function F(t) is given by:

$$S_A(t) = F(t)[S_A(\infty) + (S_A(0) - S_A(\infty))e^{-t/T_c}]$$

$$S_B(t) = F(t)[S_B(\infty) + (S_B(\infty) - S_B(0))e^{-t/T_c}]$$

Taking the ration of the two signals eliminates the systematic drift allowing the time-constant for the transport across the membrane to be determined from the MRI signal time-course, as follows:

$$\frac{S_A(t)}{S_B(t)} = \frac{S_A(\infty) + (S_A(0) - S_A(\infty))e^{-1/T}_c}{S_B(\infty) + (S_B(\infty) - S_B(0))e^{-1/T}_c}$$

Results

Figure 3A:
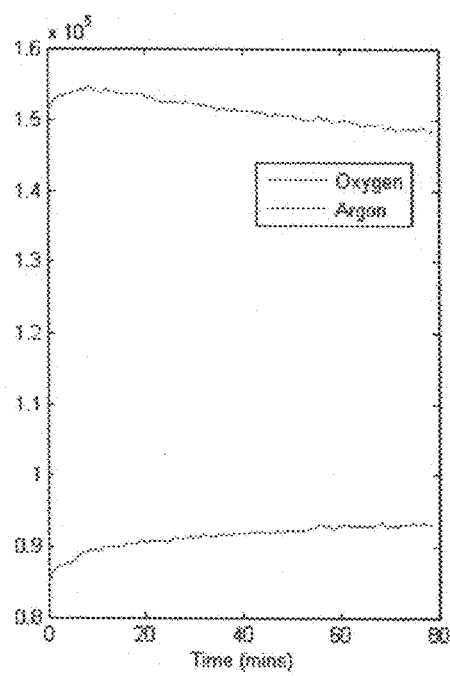
FIGS. 3A-3B provides the results of experiments on oxygen-concentration related signal changes in two chambers, one initially saturated with oxygen, the other with argon. The dividing membrane was 0.4 µm polycarbonate film. The time-constant of 59.8 minutes was calculated from the mean signal ration between the two chambers.
Figure 3B:
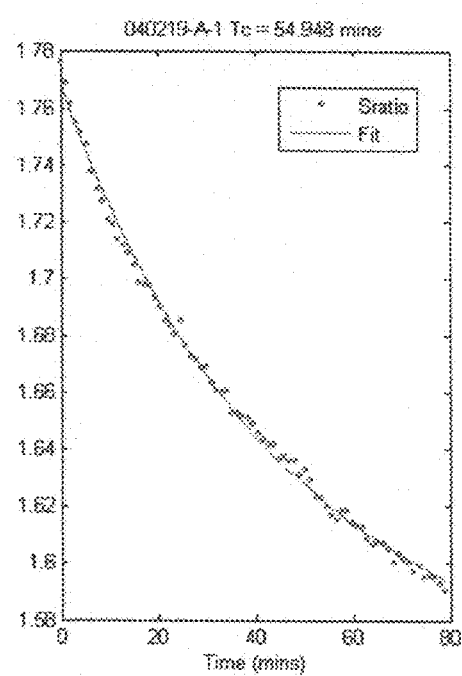

FIG. 3 provides the results of experiments on oxygen-concentration related signal changes in two chambers, one initially saturated with oxygen, the other with argon. The dividing membrane was 0.4 μm pore-size polycarbonate film. The time-constant of 54.9 minutes was calculated from the mean signal ration between the two chambers.

Figure 4A:
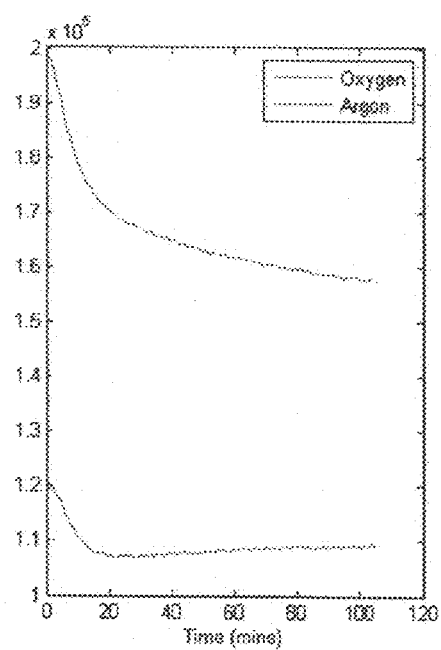
FIGS. 4A-4C provides the results of experiments on oxygen-concentration related signal changes in two chambers, one initially saturated with oxygen, the other with argon. The dividing membrane was a fresh Bruch's membrane sample from the macula region of the eye. The time-constant of 67.7 minutes was calculated from the mean signal ration between the two chambers.
Figure 4B:
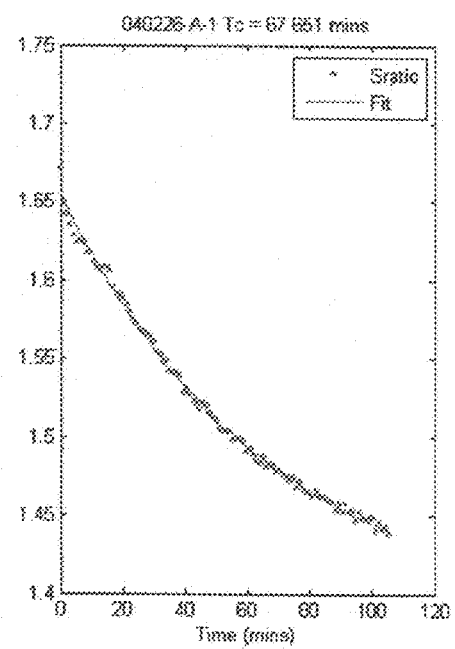
Figure 4C:
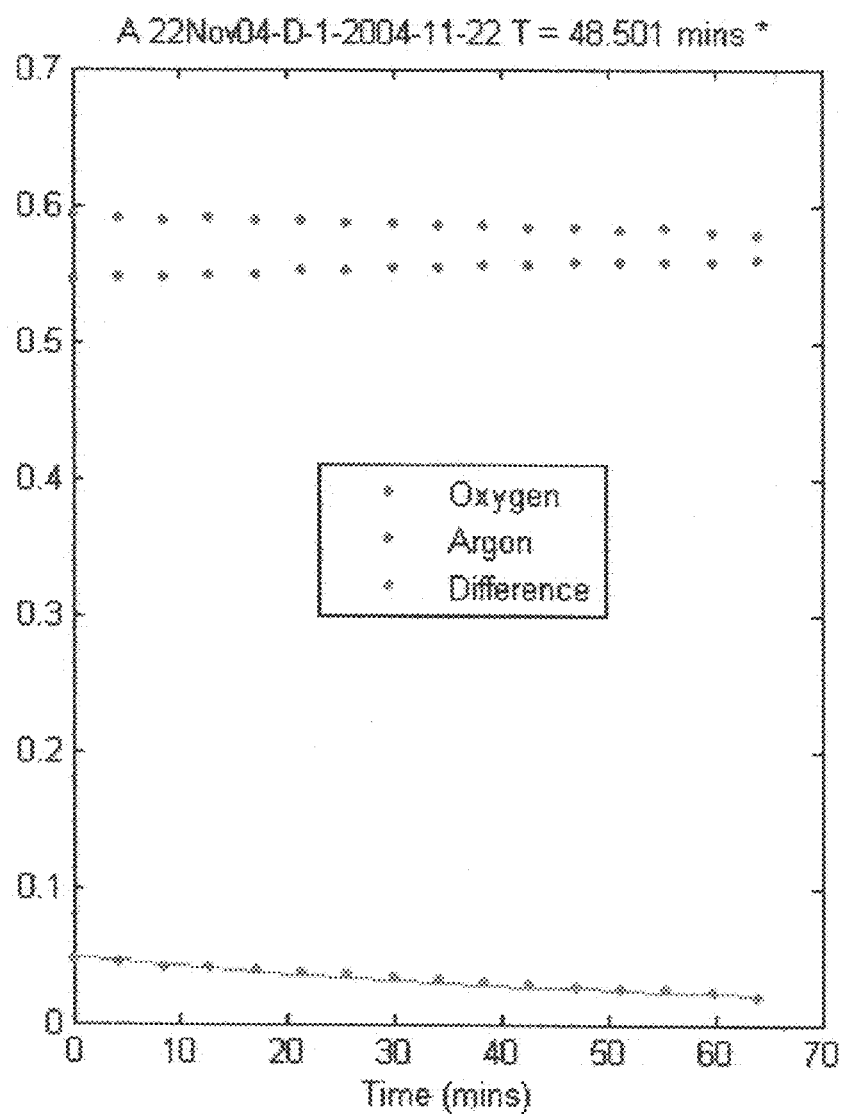

FIG. 4 provides the results of experiments on oxygen-concentration related signal changes in two chambers, one initially saturated with oxygen, the other with argon. In 4A and 4B the dividing membrane was a fresh Bruch's membrane sample from the macula region of the eye. The time-constant of 67.7 minutes was calculated from the mean signal ration between the two chambers. In 4C the dividing membrane was 12 micron pore size polycarbonate membrane and the time-constant of 48.5 minutes was estimated by exponential curve fitting to the signal difference between the chambers.

Example 3

Devices and Methods for Measuring Membrane Diffusional Permeability of a Gadolinium Chelate by Magnetic Resonance Imaging Gadolinium chelates of various molecular weights (e.g. Gadoteridol dimeglamine) may be used as MR detectable tracers which alter the T1 relaxation time of the surrounding water and thus imparts contrast to the image. The relation between chelate concentration and signal intensity can be calibrated or estimated from theory and applied to a time-series of MR images to determine the chelate concentration variation during the experiment. If the upper chamber is initially filled with a dilute aqueous solution of the chelate, and the lower chamber is filled with water, the diffusional permeability of the membrane may be estimated from the time course of either (a) the mean signal within each chamber or (b) the spatial variation of chelate above and below the membrane as determined by calibrated MR images.

Figure 5:
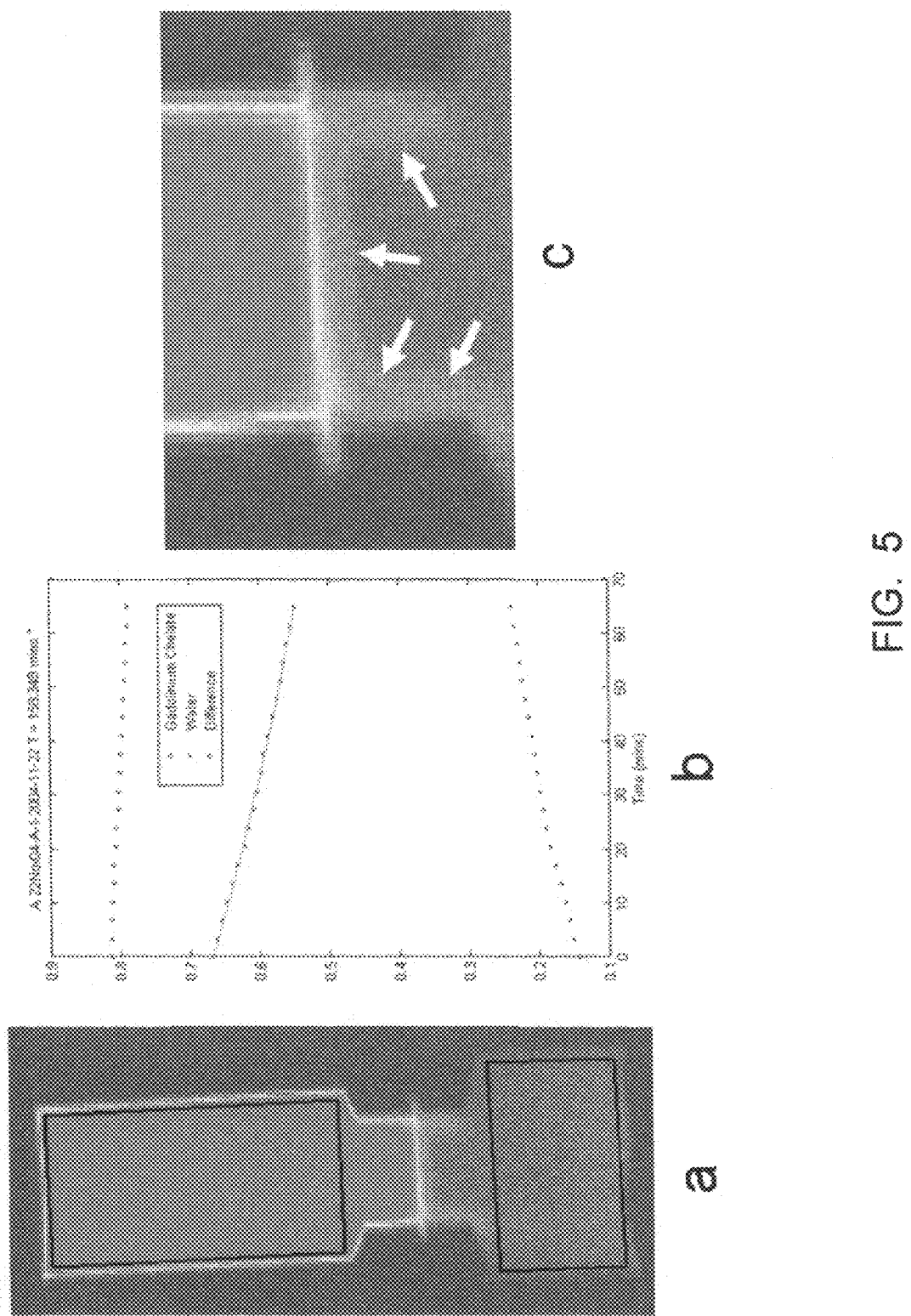
FIGS. 5A-5C provide the results of experiments on gadolinium chelate-concentration related signal changes in two chambers. (a) MR image of the membrane cell with the upper chamber initially containing 1 mM gadolinium chelate (Prohance® (gadoteridol), Bracco Diagnostics Inc., Princeton N.J.) and the lower chamber containing water. Signal enhancement due to the gadolinium chelate can be indicated by red false coloring. (b) the mean signal time course within the regions of interest indicated by black boxes in (a). The signal difference between the chambers has been fitted to an exponential and has a time-constant of approximately 158 minutes. The concentration time course in each chamber would require signal-concentration calibration. (c) Enlargement of the regions of the upper and lower chambers surrounding the membrane demonstrating the spatial variation of enhancement due to heterogeneous diffusion of the chelate below the membrane. The chelate has concentrated along the walls of the lower chamber (white arrows) before mixing into the bulk of the lower chamber. This effect would not be readily detected by non-imaging methods.
Figure 6A:
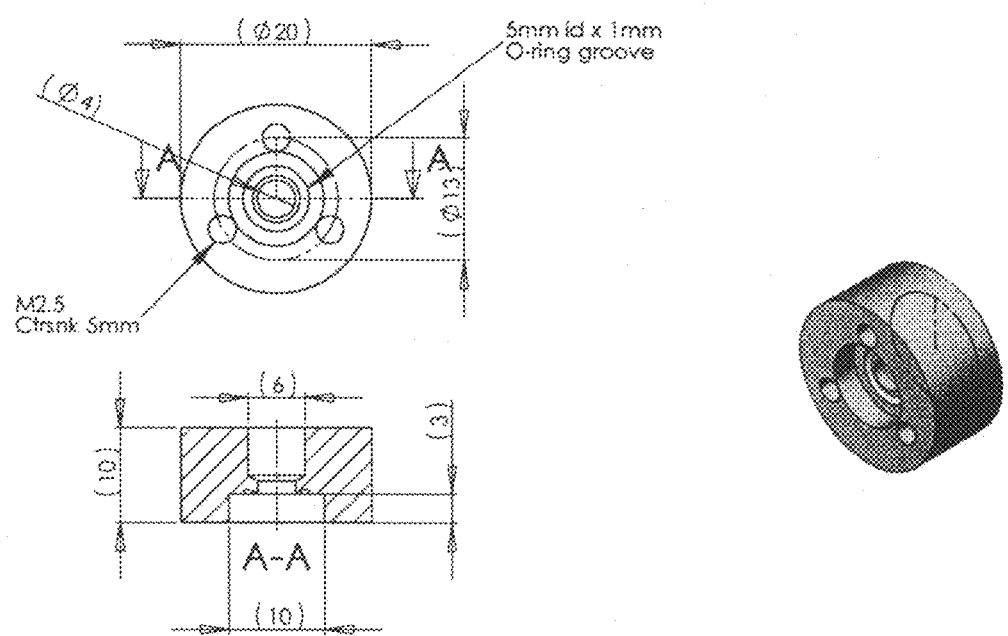
FIGS. 6A-6C provide diagrams of a typical components that can comprise a container or "membrane cell" that can be used in the methods of the invention.
Figure 6B:
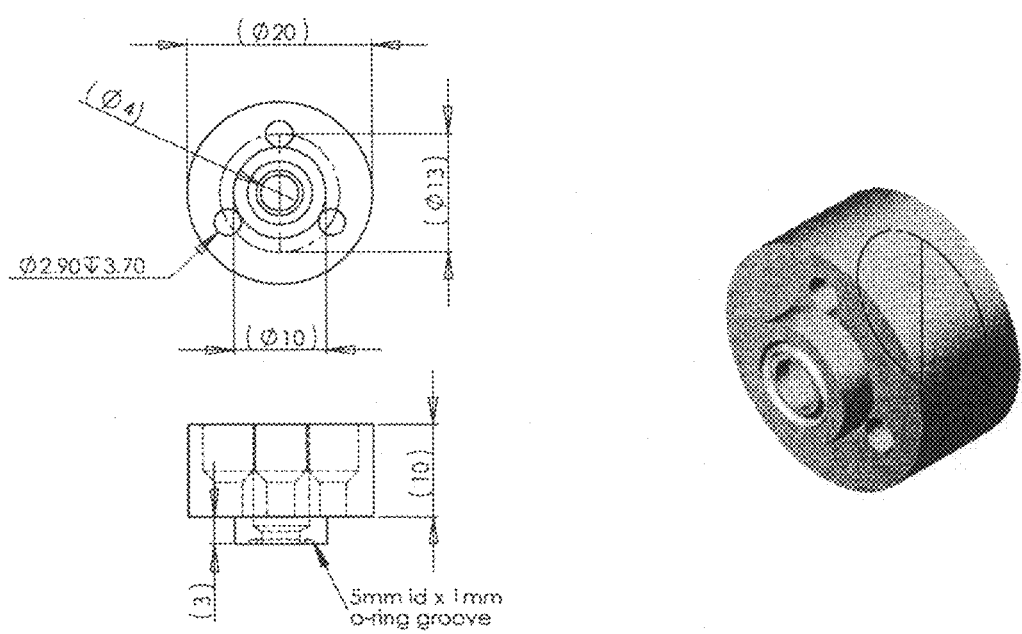
Figure 6C:
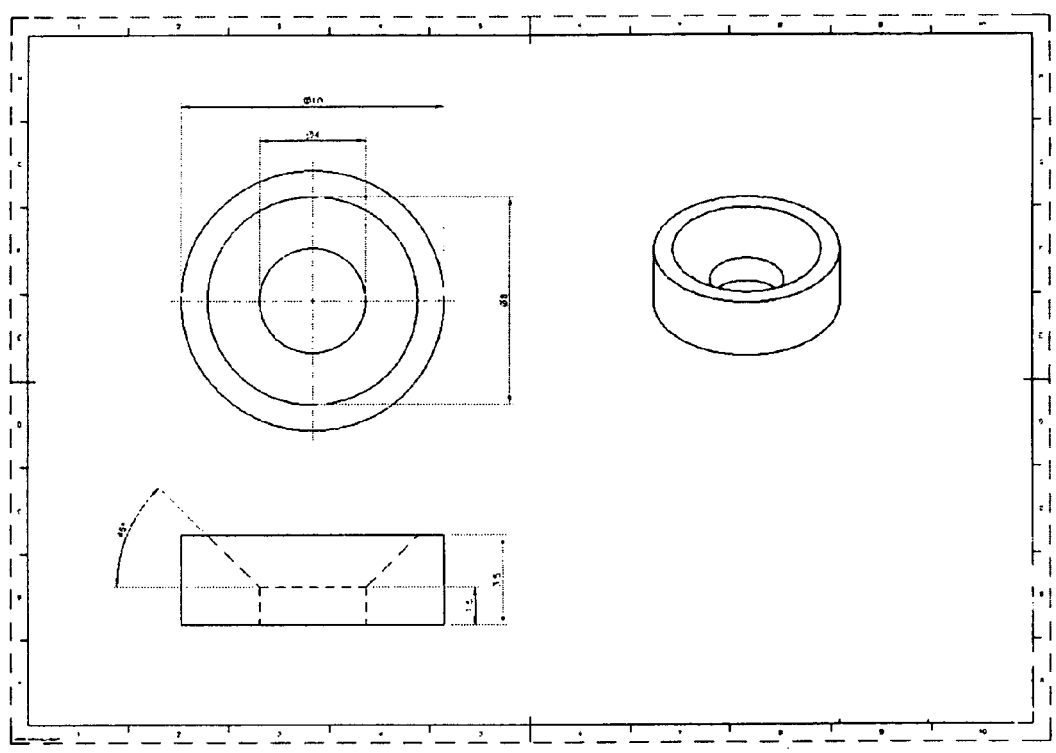

FIGS. 5A-5C provide data from an experiment using the gadolinium chelate Gadoteridol dimeglamine.

Throughout this application, various publications are referenced (e.g. articles, patents, patent applications etc.). The disclosures of these publications are hereby incorporated by reference herein in their entireties. The present invention is not to be limited in scope by the embodiments disclosed herein, which are intended as single illustrations of individual aspects of the invention, and any that are functionally equivalent are within the scope of the invention. Various modifications to the models and methods of the invention, in addition to those described herein, will become apparent to those skilled in the art from the foregoing description and teachings, and are similarly intended to fall within the scope of the invention. Such modifications or other embodiments can be practiced without departing from the true scope and spirit of the invention.

The invention claimed is:

1. A method of using magnetic resonance imaging to observe diffusion across a permeable ex vivo biological membrane in a container that comprises:
   a cap element having a chamber capable of holding a solution;
   a base element having a chamber capable of holding a solution; and
   a sample assembly element capable of holding a ex vivo biological membrane that can be disposed between the cap element and the base element;
   an O-ring element capable of securing the sample assembly element within the container;
   a first solution comprising a molecule selected to impart contrast to a magnetic resonance image;
   a second solution; and
   a permeable ex vivo biological membrane disposed between the first solution and the second solution;
   the method comprising using magnetic resonance imaging to obtain an image of the diffusion of the molecule in the first solution across the permeable ex vivo biological membrane in to the second solution,
   such that diffusion across the permeable ex vivo biological membrane in the container is observed.

2. The method of claim 1, wherein the molecule selected to impart contrast to the magnetic resonance image is deuterium oxide ($D_2O$).

3. The method of claim 1, wherein the molecule selected to impart contrast to the magnetic resonance image is oxygen ($O_2$).

4. The method of claim 1, wherein the molecule selected to impart contrast to the magnetic resonance image is a gadolinium chelate.

5. The method of claim 1, wherein diffusion of the molecule in the first solution across the membrane in to the second solution:
   (a) is observed in the absence of a pressure differential across the membrane; or
   (b) is observed in the presence of a pressure differential across the membrane that is less than 10 Pascals.

6. The method of claim 1, wherein magnetic resonance imaging is used to obtain a plurality of sequential images of the diffusion of the molecule in the first solution across the membrane in to the second solution.

7. The method of claim 6, wherein the sequential magnetic resonance images are acquired of a midline slice through the container that is parallel to the long-axis of the container.

8. The method of claim 6, wherein the sequential magnetic resonance images observe a change in the magnetic resonance signal intensity over time.

9. The method of claim 8, wherein the magnetic resonance imaging is used to calculate the diffusional permeability of the membrane.

10. The method of claim 9, wherein the diffusional permeability of the membrane is calculated using mean signal time-course measurements and/or mass transport equations.

11. The method of claim 1, wherein the composition of the container is selected to facilitate the magnetic resonance imaging.

12. The method of claim 11, wherein the composition is selected so that it is not ferromagnetic and/or is not metallic.

13. A method of using magnetic resonance imaging to observe diffusion across a permeable ex vivo biological membrane in a container that comprises:
   a cap element having a chamber capable of holding a solution;
   a base element having a chamber capable of holding a solution; and
   a sample assembly element capable of holding a permeable ex vivo biological membrane that can be disposed between the cap element and the base element;
   an O-ring element capable of securing the sample assembly element within the container;
   a first solution comprising a molecule selected to impart contrast to a magnetic resonance image;
   a second solution; and
   a permeable ex vivo biological membrane disposed between the first solution and the second solution;
   the method comprising using magnetic resonance imaging to obtain an image of the diffusion of the molecule in the first solution across the permeable ex vivo biological membrane in to the second solution,
   such that diffusion across the permeable ex vivo biological membrane in the container is observed;
   wherein:
      magnetic resonance imaging is used to obtain a plurality of sequential images of the diffusion of the molecule in the first solution across the permeable ex vivo biological membrane into the second solution;
      the sequential magnetic resonance images observe a change in the magnetic resonance signal intensity over time; and
      the magnetic resonance imaging is used to calculate the diffusional permeability of the permeable ex vivo biological membrane using mean signal time-course measurements and/or mass transport equations.

* * * * *